United States Patent
Shields et al.

(12) 
(10) Patent No.: US 6,441,418 B1
(45) Date of Patent: *Aug. 27, 2002

(54) SPACER NARROWED, DUAL WIDTH CONTACT FOR CHARGE GAIN REDUCTION

(75) Inventors: Jeffrey A. Shields, Sunnyvale; Bharath Rangarajan, Santa Clara, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/430,848

(22) Filed: Nov. 1, 1999

(51) Int. Cl.⁷ .............................................. H01L 31/062
(52) U.S. Cl. ...................................... 257/296; 257/775
(58) Field of Search ................................ 257/758, 774, 257/306, 311, 296, 300, 390, 750, 751, 775; 438/620, 622, 634, 638, 639, 640, 675

(56) References Cited

U.S. PATENT DOCUMENTS

| | | | |
|---|---|---|---|
| 4,977,108 A | | 12/1990 | Haskell |
| 5,028,555 A | | 7/1991 | Haskell |
| 5,081,060 A | * | 1/1992 | Kim ........................... 438/586 |
| 5,100,838 A | * | 3/1992 | Dennison ................... 438/586 |
| 5,210,047 A | | 5/1993 | Woo et al. |
| 5,275,963 A | | 1/1994 | Cederbaum et al. |
| 5,459,354 A | | 10/1995 | Hara |
| 5,512,779 A | | 4/1996 | Noda |
| 5,646,063 A | | 7/1997 | Mehta et al. |
| 5,652,182 A | | 7/1997 | Cleeves |
| 5,668,052 A | | 9/1997 | Matsumoto et al. |
| 5,792,684 A | | 8/1998 | Lee et al. |
| 5,795,823 A | * | 8/1998 | Avanzino et al. ............ 438/639 |
| 5,807,779 A | | 9/1998 | Liaw |
| 5,885,865 A | * | 3/1999 | Liang et al. ................. 438/253 |
| 5,899,742 A | | 5/1999 | Sun |
| 5,907,781 A | | 5/1999 | Chen et al. |
| 5,960,318 A | * | 9/1999 | Peschke et al. ............. 438/637 |
| 6,027,966 A | * | 2/2000 | Saenger et al. ............. 438/239 |
| 6,033,980 A | * | 3/2000 | Liou et al. .................. 438/624 |
| 6,150,223 A | | 11/2000 | Chern et al. |
| 6,156,636 A | | 12/2000 | Yeom et al. |

FOREIGN PATENT DOCUMENTS

| | | |
|---|---|---|
| EP | 0854508 A2 | 12/1997 |
| EP | 0326293 A1 | 1/1998 |
| GB | 2268329 A | 11/1993 |
| TW | 299482 * | 8/1996 ........... H01L/21/70 |

OTHER PUBLICATIONS

Wolf S., "Silicon Processing for the VLSI Era", vol. 2, Lattice Press, Sunset beach, CA, 1990.*
Wolf, S., "Silicaon Processing for the VLSI Era", vol. 2, Lattice Press, Sunset Beach, CA., 1990. (2 pgs.).

(List continued on next page.)

*Primary Examiner*—Olik Chaudhuri
*Assistant Examiner*—Ginette Peralta
(74) *Attorney, Agent, or Firm*—Foley & Lardner

(57) ABSTRACT

A method of forming a contact in an integrated circuit is disclosed herein. The method includes providing a first insulating layer over a semiconductor substrate including first and second gate structures, providing an etch stop layer over the first insulating layer, providing a second insulating layer over the etch stop layer, creating a first aperture in the second insulating layer between the first and second gate structures, forming spacers along the side walls of the first aperture, creating a second aperture in the first insulating layer below the first aperture, and filling the aperture with a conductive material to form the contact. The first aperture has a first aperture width and extends to the etch stop layer. The second aperture has a second aperture width which is less than the first aperture width.

20 Claims, 5 Drawing Sheets

OTHER PUBLICATIONS

Ishigaki, Y., et al. "Low Parasitic Resistance Technologies with NES–SAC and SWT–CVD Process" 1994 IEEE Symposium on VLSI Technology Digest of Technical Papers, Jun. 1994, pp. 99–100.

Kuesters, K, et al. "Self–Aligned Bitline Contact for 4Mbit DRAM" Proceedings of the 1987 Symposium on ULSI Science and Technology, pp. 640–649.

Kaanta, C., et al. "Dual Damascene: A ULSI Wiring Technology", Jun. 11–12 1991 VMIC Conference, IEEE.

IBM Technical Disclosure Bulletin, vol. 36 No. 11, Nov. 1993, "Damascene: Optimized Etch Stop Structure and Method", p. 649.

Vollmer, B. et al. "Recent Advances in the Application of Collimated Sputtering" (PCT 206). 2194 Thin Solid Films 247 (1994), Jul. 1, No. 1, Luasanne, CH, pp. 104–111.

* cited by examiner

SPACER NARROWED, DUAL WIDTH CONTACT FOR CHARGE GAIN REDUCTION

CROSS REFERENCE TO RELATED APPLICATIONS

This patent application is related to U.S. application Serial No. 09/705,941 by Rangarajan, et al., entitled "Method of Reducing Contact Size by Spacer Filling"; U.S. application Ser. No. 09/357,767, by Park et al., entitled "Native Oxide Removal With Fluorinated Chemistry Before Cobalt Silicide Formation Using Nitride Spacers"; U.S. application Ser. No. 09/532,293 by Park et al. entitled "Flash Memory With Less Susceptibility To Charge Gain And Charge Loss"; and U.S. application Ser. No. 09/430,845, by Shields, et al., entitled "Dual Width Contact For Charge Gain Reduction", all of which are assigned to the assignee of the present invention.

FIELD OF THE INVENTION

The present invention relates to integrated circuits and to methods of manufacturing integrated circuits. More particularly, the present invention relates to a method of reducing charge gain by forming a spacer narrowed, dual width contact.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Flash memory cells are generally comprised of a transistor connected to a word line and a bit line. The transistor includes a gate stack comprised of a polysilicon cap, a control gate, a control gate dielectric, a floating gate, and a tunnel oxide. The polysilicon cap is disposed over the control gate, which is disposed over the control gate dielectric. The control gate dielectric is disposed over the floating gate, which is disposed over the tunnel oxide. The gate stack is located between a source and a drain. An insulative spacer abuts each side of the gate stack. The drain is connected to the bit line through a contact. The word line is connected to the control gate of the transistor. The flash memory cell stores data (e.g., a 1 or 0) in the floating gate.

Generally, the transistor is covered by a high temperature oxide and an interlevel dielectric to insulate it from subsequently formed metal layers. An aperture or hole is etched through the interlevel dielectric and the high temperature oxide. The hole is filled with a conductive material to provide connections to the transistor, to conductors, or to other circuit structures. For example, a contact can extend from the bitline through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves spacing between gate stacks and contacts. As mentioned above, contacts are required in an IC device to provide electrical connections between layers or levels of the integrated circuit device. Semiconductor devices typically include a multitude of transistors which are coupled together in particular configurations through contacts.

Contacts are generally coupled to the source region and/or drain region of the transistors disposed on the integrated circuit. The contact is often connected to the source and drain region via a silicide layer formed in a high temperature process. The silicide layer reduces drain/source series resistance.

In conventional processes, contacts must be spaced from the gate conductor by a minimum acceptable distance (often at least one minimum lithographic feature). Charge loss and charge gain can occur when electrons travel laterally through the high temperature oxide or interlayer dielectric between the contact and the floating gate. Such charge gain and loss in the floating gate can destroy or corrupt the data stored in the memory cell.

Indeed, as integrated circuits have become more dense, distances between transistors and transistor components has become smaller. As the distance between contacts and floating gates decreases, a transistor's susceptibility to charge gain and loss is also increased. Therefore, charge gain and loss problems associated with contacts can be particularly troublesome as integrated circuits contain more transistors.

One possible solution is to increase the space on the IC layout. Nevertheless, increased contact to gate structure spacing results in lower device density. Another possible solution is to reduce the contact size by printing smaller contacts. However, printing very small contacts is a challenge to lithography. Further, small contacts cause problems associated with high contact resistance.

Thus, there is a need to reduce the charge gain and loss problem associated with spacing between the contact and the gate structure. Further, there is a need to reduce contact size while avoiding manufacturing difficulties associated with small contacts. Even further, there is a need for narrow dual width contacts which provide charge loss reduction.

SUMMARY OF THE INVENTION

One embodiment of the invention relates to a method of forming a contact in an integrated circuit. The method includes providing a first insulating layer over a semiconductor substrate including first and second gate structures, providing an etch stop layer over the first insulating layer, providing a second insulating layer over the etch stop layer, creating a first aperture in the second insulating layer between the first and second gate structures, forming spacers along the side walls of the first aperture, creating a second aperture in the first insulating layer below the first aperture, and filling the first and second apertures with a conductive material to form the contact. The first aperture has a first aperture width and extends to the etch stop layer. The second aperture has a second aperture width which is less than the first aperture width.

Another embodiment of the invention relates to a method of forming a spacer narrowed, dual width contact in an integrated circuit including an insulating layer. The method includes creating a first aperture in the insulating layer with side walls and a first aperture width, forming spacers along the side walls of the first aperture, creating a second aperture in the insulating layer with a second aperture width, and providing a contact which fills the aperture. The first aperture width is greater than the second aperture width.

Another embodiment of the invention relates to an integrated circuit. The integrated circuit includes an insulating layer including an aperture extending from the top of the insulating layer to the bottom of the insulating layer and defining a contact hole. Spacers are located along side walls of the contact hole and a contact material fills the contact hole. The contact hole has a first width at a top portion of the aperture and a second width at a bottom portion of the aperture.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
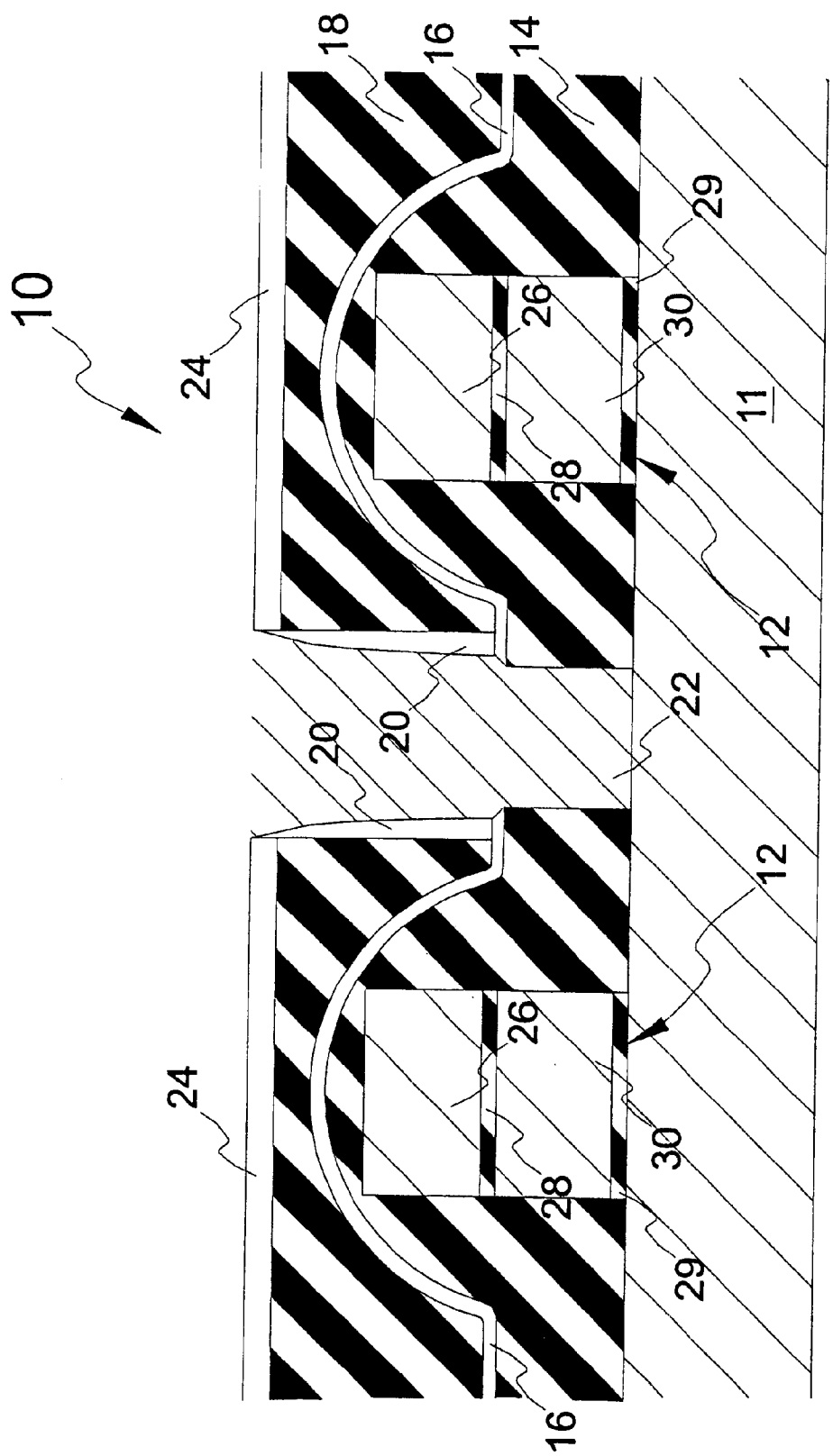
FIG. 1 is a cross-sectional view of a portion of an integrated circuit in accordance with an exemplary embodiment of the present invention.

Referring to FIG. 1, a cross-sectional view of a portion 10 of an integrated circuit is illustrated in accordance with an exemplary embodiment of the present invention. Portion 10 illustrates an interlevel dielectric (ILD) stack including polysilicon or gate structures 12, a first oxide layer 14, an etch stop layer 16, a second oxide layer 18, spacers 20, a contact 22, and a hardmask layer 24. Alternatively, other structures may also be included in the ILD stack. Portion 10 is provided on substrate 11. Substrate 11 can be silicon or any semiconducting material.

In the embodiment shown in FIG. 1, each gate structure 12 includes a control gate 26, a control gate dielectric 28, a tunnel dielectric 29, and a floating gate 30. Control gate 26 is a conductor, such as, polysilicon which provides a control or switch for gate structure 12. Control gate dielectric 28 is any of a variety of dielectric materials and isolates control gate 26 from floating gate 30. Tunnel dielectric 29 is preferably an oxide layer. Floating gate 30 is a conductor, such as, polysilicon which stores a charge representing data (e.g., a 1 or 0).

First oxide layer 14 is a layer of an insulating material that separates contact 22 from gate structure 12. First oxide layer 14 can be a single layer or a composite layer. Additionally, layer 14 can be provided over a high temperature oxide layer.

Etch stop layer 16 is a layer of material, such as, nitride ($Si_3N_4$) or SiON, which serves as a stop for typical etching processes. Etch stop layer 16 is located intermediate first oxide layer 14 and second oxide layer 18. In an exemplary embodiment of the present invention, etch stop layer 16 provides a layer at which etching stops during formation of contact 22. Preferably, the portion of etch stop layer 16 proximate contact 22 is located at the same vertical level as the top of floating gate 30.

When etch stop layer 16 is removed, its width tapers, providing a narrower opening for the formation of contact 22 adjacent to first insulating layer 14. As such, contact 22 is narrower where contact 22 is closest to floating gate 30, reducing charge gain and loss effects. Alternatively, etch stop layer 16 is located at a position which is higher than the vertical level of the top of floating gate 30. Second oxide layer 18 is a layer of insulating material, such as TEOS or silane based oxide. Layer 18 can be a single layer or a composite layer.

Spacers 20 are any dielectric material, such as, silicon dioxide or silicon nitride, and are located intermediate second oxide layer 18 and contact 22.

Spacers 20 advantageously increase the distance between gate structures 12 and contact 22 by the width of one spacer.

Contact 22 is a conductive material which provides an electrical connection to source or drain regions located in substrate 11 of the integrated circuit. In an exemplary embodiment, contact 22 includes a narrow dimension at the bottom of portion 10 and a larger and easier to pattern dimension at the top of portion 10. Hardmask layer 24 is an antireflective coating used in the selective etching process.

In the exemplary embodiment shown in FIG. 1, contact 22 has a top section width of 0.35 $\mu$m and a bottom section width of 0.25–0.30 $\mu$m. The distance between the bottom section of contact 22 and floating gate 30 is preferably between 0.1–0.25 $\mu$m. Also, first insulating layer 14 has a preferable thickness of 500–2,000 Å proximate contact 22 and second insulating layer 18 has a preferable thickness of 4,000–10,000 Å proximate contact 22. Etch stop layer 16 has a thickness of 100–500 Å. Spacers 20 have a width of approximately 10–500 Å.

Figure 2:
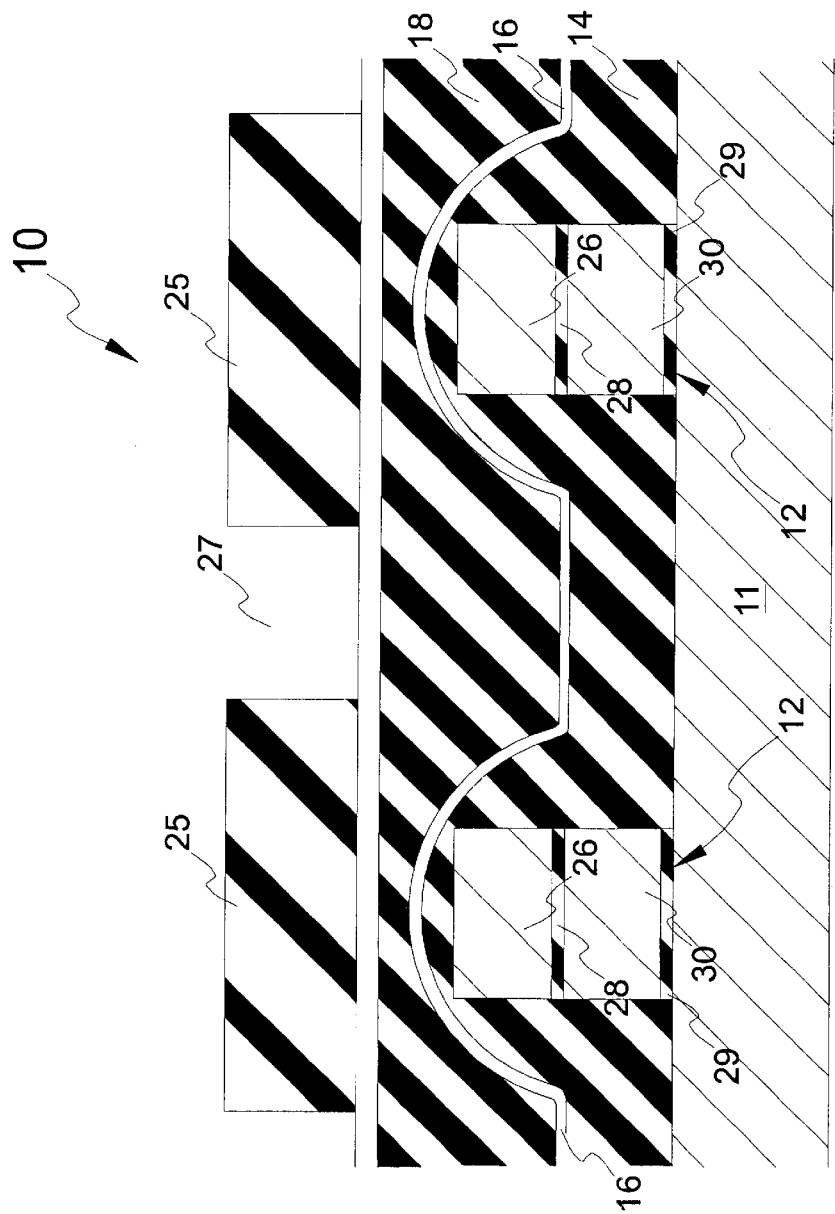
FIG. 2 is a cross-sectional view of the portion of the integrated circuit of FIG. 1, illustrating a contact hole in a resist layer in a method of forming a narrow dual width contact which provides charge gain and loss reduction in accordance with the present invention.

The method of forming portion 10 is described below with reference to FIGS. 1–5. The method advantageously forms portion 10 including a narrow dual width contact which provides for charge loss and gain reduction. In FIG. 2, a cross-sectional view of portion 10 illustrates a contact hole 27 in a resist layer 25. Dry etching may be used to form contact hole 27. Alternatively, other removal processes may be used.

Figure 3:
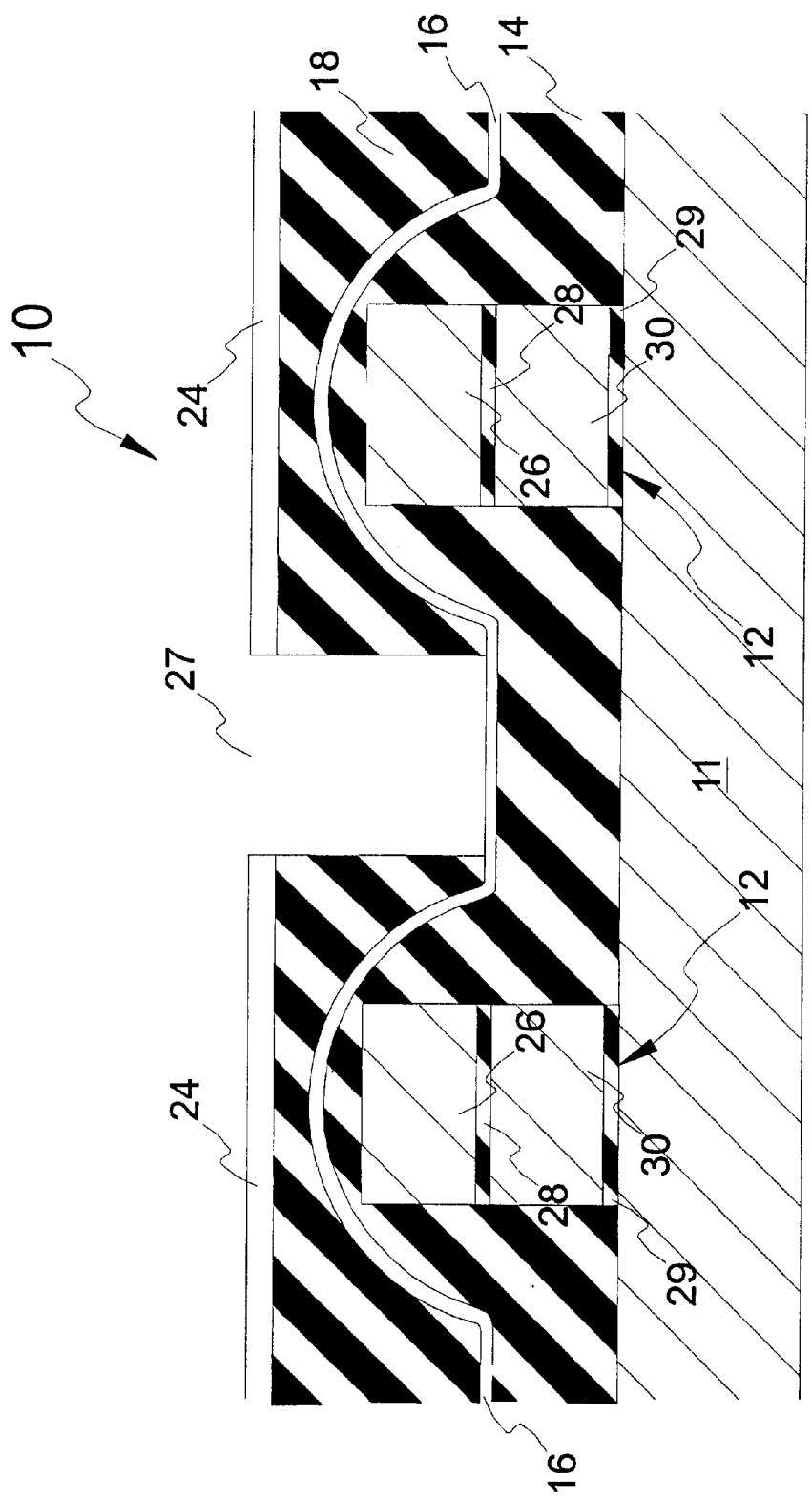
FIG. 3 is a cross-sectional view of the portion of the integrated circuit of FIG. 1, illustrating a first etch step in a method of forming a narrow dual width contact which provides charge gain and loss reduction.

In FIG. 3, a cross-sectional view of portion 10 illustrates a first anisoptropic etch step in the method of forming a narrow dual width contact. Any of a variety of etch or removal processes can be used to extend contact hole 27 through hardmask layer 24 and second oxide layer 18 to etch stop layer 16. Preferably, contact hole 27 is etched substantially half way into the oxide, or through second oxide layer 18, stopping on etch stop layer 16.

Figure 4:
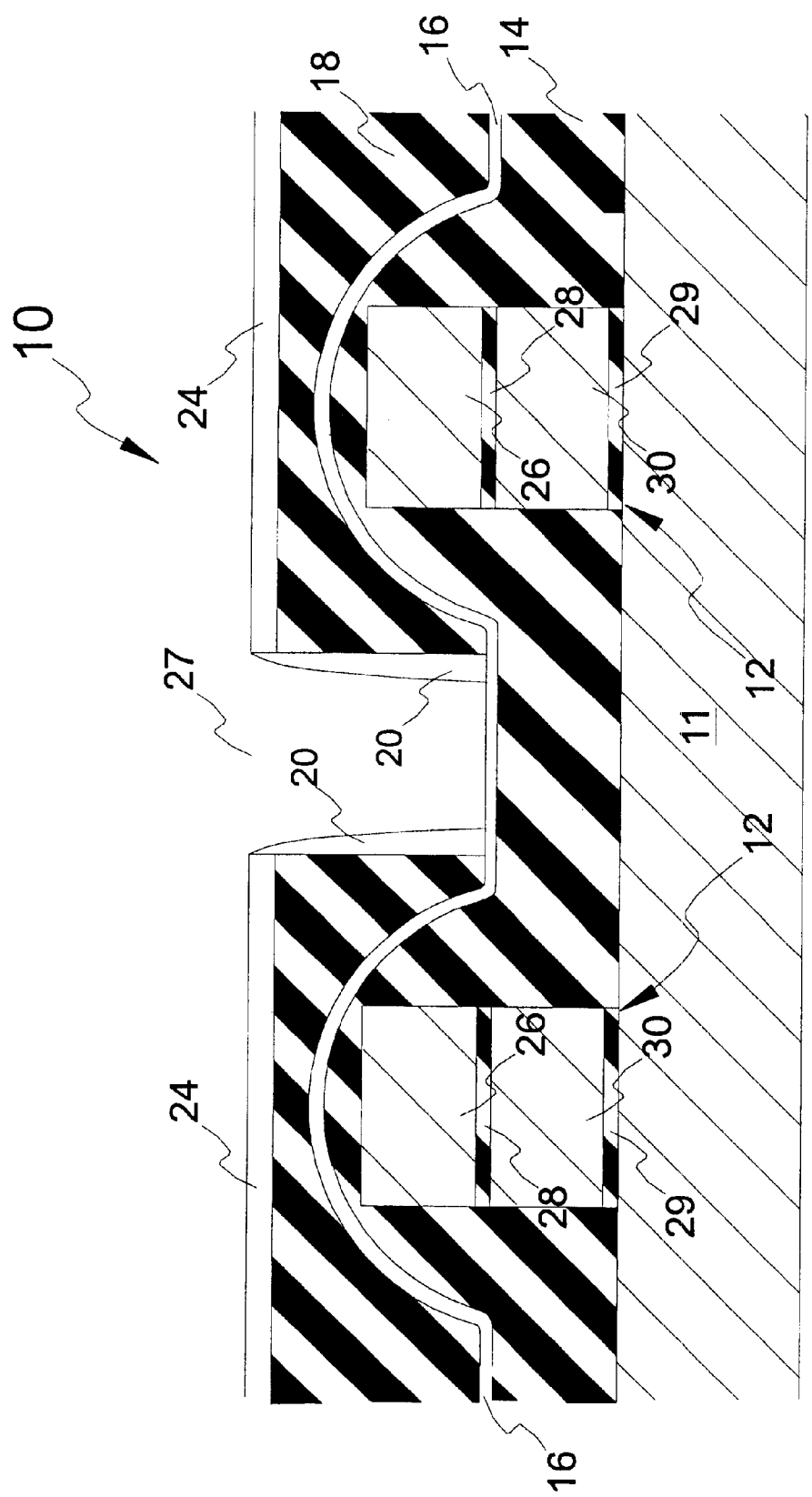
FIG. 4 is a cross-sectional view of the portion of the integrated circuit of FIG. 1, illustrating a spacer deposition and etch step in a method of forming a narrow dual width contact which provides charge gain and loss reduction.

In FIG. 4, a cross-sectional view of portion 10 illustrates a spacer deposition and etch step in which spacers 20 are formed in contact hole 27. Afterwards, in FIG. 5, a portion of etch stop layer 16 is removed, and contact hole 27 is extended by etching to form an opening in first oxide layer 14 which is narrower than the opening in second oxide layer 18. Spacers 20 are any dielectric material, such as, nitride or oxide and are formed in any of a variety of methods.

In one particular embodiment, the spacer deposition step includes the depositing of a conformal layer of a dielectric material. The conformal layer of dielectric material partially fills contact hole 27. The conformal layer is etched or removed to leave spacers 20 in contact hole 27. Preferably, the conformal layer includes nitride.

Etch stop layer 16 is stripped between spacers 20 and contact hole 27 is extended through first oxide layer 14 to make electrical contact with a source or drain region in the substrate. The stripping process of etch stop layer 16 naturally results in a tapered width of the removed portion. The width of contact hole 27 in first oxide layer 14 is determined by the width between spacers 20. Hence, the width of contact hole 27 at etch stop layer 16 is narrower.

Figure 5:
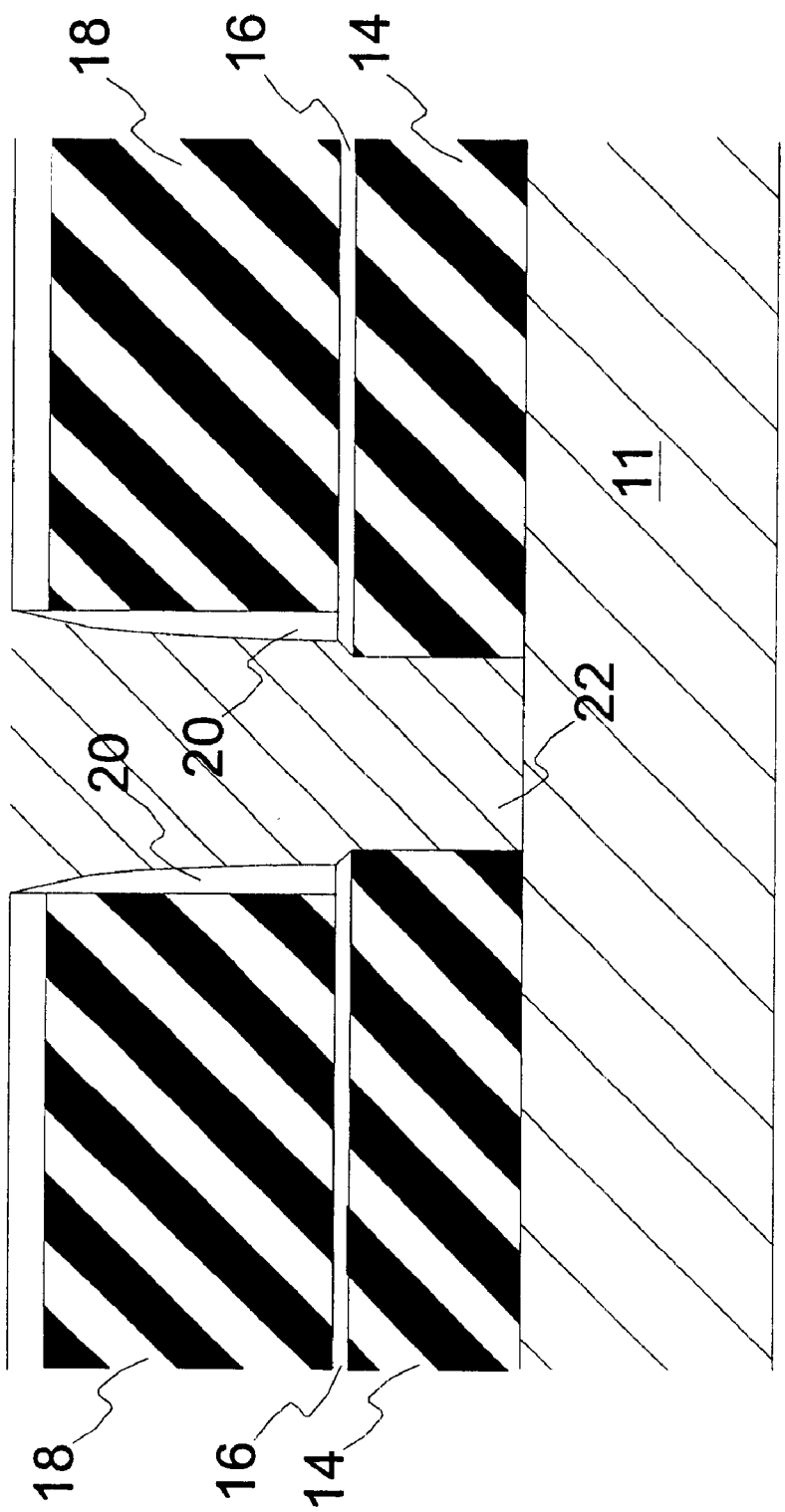
FIG. 5 is a cross-sectional view of the spacers and dual width contact in the portion of the integrated circuit of FIG. 1.

Referring now to FIG. 1, the cross-sectional view illustrates portion 10 including contact 22 filling contact hole 27 between spacers 20. Contact 22 provides a structure for electrically coupling regions in the substrate with devices or other transistors. In FIG. 5, a cross-sectional view of spacers 20 and dual width contact 22 in portion 10 illustrates in greater detail that contact 22 has a first width at the top of portion 10 and a second width at the bottom of portion 10. The first width is greater than the second width. Advantageously, the described method allows contact 22 to be easily printed and etched. Further, spacers 20 provide an increased distance between gate structure 12 and contact 22.

Thus, the method described with reference to FIGS. 1–5 reduces the charge-gain problem associated with spacing between contact 22 and gate structures 12. In particular, charge loss and gain between dual width contact 22 and floating gate 30 is avoided. Further, the method reduces contact size while avoiding manufacturing difficulties associated with small contacts. Even further, the method produces narrow dual width contacts which provide charge gain reduction.

The method of forming portion 10 described with reference to FIGS. 1–5 includes two etching processes, separated by a spacer deposition and etch and a stripping of etch stop layer 16.

While the embodiments illustrated in the FIGURES and described above are presently preferred, it should be understood that these embodiments are offered by way of example only. Other embodiments may include, for example, different techniques for providing spacers 20 in contact hole 27. The invention is not limited to a particular embodiment, but extends to various modifications, combinations, and permutations that nevertheless fall within the scope and spirit of the appended claims.

What is claimed is:

1. An integrated circuit comprising:
   two flash memory gate structures separated by an insulating layer, the insulating layer including an aperture extending from the top of the insulating layer to the bottom of the insulating layer, wherein the aperture defines a contact hole;
   an etch stop layer, the etch stop layer being located in the insulating layer;
   a conductive contact, the conductive contact being located in the aperture and having a top portion extending from the top of the aperture to the etch stop layer and a bottom portion extending from the top portion to the bottom of the aperture, wherein the entire bottom portion has a width less than the top portion; and
   dielectric spacers, the dielectric spacers being located along side walls of the entire top portion.

2. The integrated circuit of claim 1, wherein the dielectric spacers are located only along the side walls of the top portion.

3. The integrated circuit of claim 1, wherein the aperture is formed by a first and second etch, the first etch removing material from the insulating layer down to the etch stop layer.

4. The integrated circuit of claim 3, wherein the aperture is formed by removing a portion of the etch stop layer.

5. The integrated circuit of claim 4, wherein the second etch removes material from the insulating layer below the removed portion of the etch stop layer.

6. The integrated circuit of claim 4, wherein the removed portion of the etch stop layer includes a tapered width.

7. The integrated circuit of claim 1, wherein the top portion is located in substantially the upper half of the insulating layer and the bottom portion is located in substantially the lower half of the insulating layer.

8. An integrated circuit comprising:
   two gate structures, the gate structures having a control gate and a floating gate;
   two insulative layers separating the two gate structures;
   an etch stop layer disposed between the two insulative layers;
   a first section of conductive material having a first width, the first section being located in an aperture of one of the two insulative layers and extending below the etch stop layer;
   a second section of conductive material disposed over the first section and located in an aperture of the other of the two insulative layers and above the etch stop layer, the entire second section having a width greater than the first width; and
   spacers along lateral walls of the entire aperture of the second section.

9. The integrated circuit of claim 8, wherein the lateral side walls of the second section have a tapered width.

10. The integrated circuit of claim 8, wherein the spacers have a first spacer width at the top of the second section and a second spacer width at the bottom of the second section, the first spacer width being less than the second spacer width.

11. The integrated circuit of claim 10, wherein the top of the second section has a width of 0.35 $\mu$m and the bottom of the second section has a width of between 0.25 and 0.30 $\mu$m.

12. The integrated circuit of claim 8, wherein the spacers have a width of 100–500 Å.

13. An integrated circuit comprising:
   two flash memory gate structures;
   a conductive contact located between the flash memory gate structures and having a first portion and a second portion, the second portion disposed over the first portion and having a width greater than the first portion;
   an insulative layer located adjacent to the first portion;
   a dielectric spacer located adjacent to the second portion; and
   an etch stop layer located intermediate the insulative layer and the dielectric spacer and having a tapered portion located adjacent to the conductive contact.

14. The integrated circuit of claim 13, wherein the second portion extends above a top surface of the etch stop layer and the first portion extends below a bottom surface of the etch stop layer.

15. The integrated circuit of claim 14, wherein the dielectric spacer extends along the entire second portion.

16. The integrated circuit of claim 13, wherein the conductive contact includes a tapered width proximate the tapered portion of the etch stop layer.

17. The integrated circuit of claim 13, wherein the dielectric spacer has a first spacer width proximate the top of the second portion and a second spacer width proximate the bottom of the second portion, the first spacer width being greater than the second spacer width.

18. The integrated circuit of claim 13, wherein the dielectric spacer has a width of approximately 100–500 Å.

19. The integrated circuit of claim 13, wherein second portion includes a top portion and a bottom portion, the top portion having a width greater than the bottom portion.

20. The integrated circuit of claim 19, wherein the top portion has a width of approximately 0.35 μm and the bottom portion has a width of approximately 0.25–0.30 μm.

* * * * *